United States Patent
Naito et al.

(10) Patent No.: US 11,623,238 B2
(45) Date of Patent: Apr. 11, 2023

(54) COATING METHOD, COATING BAR HEAD AND COATING APPARATUS

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Katsuyuki Naito, Bunkyo (JP); Naomi Shida, Minato (JP); Mitsunaga Saito, Inzai (JP); Yutaka Saita, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

(*) Notice: Subject to any disclaimer, the term of this patent is extended or adjusted under 35 U.S.C. 154(b) by 10 days.

(21) Appl. No.: 17/186,789

(22) Filed: Feb. 26, 2021

(65) Prior Publication Data

US 2021/0178420 A1    Jun. 17, 2021

Related U.S. Application Data

(63) Continuation of application No. PCT/JP2019/035560, filed on Sep. 10, 2019.

(51) Int. Cl.
*B05C 11/02* (2006.01)
*B05C 5/02* (2006.01)
(Continued)

(52) U.S. Cl.
CPC .............. *B05C 11/023* (2013.01); *B05C 5/02* (2013.01); *B05D 1/28* (2013.01)

(58) Field of Classification Search
USPC .................................. 118/402, 404, 405, 410
See application file for complete search history.

(56) References Cited

U.S. PATENT DOCUMENTS 3,496,012 A * 2/1970 Biorseth ................. D21H 23/40
118/410
4,537,801 A * 8/1985 Takeda ..................... G03C 1/74
118/410
(Continued)

FOREIGN PATENT DOCUMENTS

JP     62-117666 A    5/1987
JP     05-220438 A    8/1993
(Continued)

OTHER PUBLICATIONS

International Search Report dated Oct. 21, 2019 in PCT/JP2019/03556 filed on Sep. 10, 2019 (with English of Categories of Cited Documents), 4 pages.

*Primary Examiner* — Yewebdar T Tadesse
(74) *Attorney, Agent, or Firm* — Maier & Maier, PLLC

(57) ABSTRACT

An embodiment of the present invention provides a coating method, a coating bar head and a coating apparatus which enables coating in which changes in coating film thickness is less likely to occur, even when performing meniscus coating at a high speed. This coating method is a coating method including: supplying a coating liquid between a coating bar head and a substrate to form a meniscus; and moving the substrate, wherein a cross section of the coating surface of the bar head in the direction of coating, is a convex curve, and has bending points at both ends of the curve.

7 Claims, 2 Drawing Sheets

(51) Int. Cl.
*B05C 1/04* (2006.01)
*B05D 1/28* (2006.01)

(56) References Cited

U.S. PATENT DOCUMENTS

| | | |
|---|---|---|
| 4,717,603 A | 1/1988 | Chino et al. |
| 5,250,320 A | 10/1993 | Suzuki et al. |
| 5,718,429 A * | 2/1998 | Keller, Jr. ........... A63F 3/00157 |
| | | 273/459 |
| 6,361,828 B1 | 3/2002 | Tomaru et al. |
| 7,927,668 B2 | 4/2011 | Tanaka et al. |
| 2002/0121239 A1* | 9/2002 | Tonazzi .................... B05C 9/02 |
| | | 118/244 |
| 2016/0271636 A1 | 9/2016 | Saeki et al. |

FOREIGN PATENT DOCUMENTS

| | | |
|---|---|---|
| JP | 05-237438 A | 9/1993 |
| JP | 2684487 B2 | 12/1997 |
| JP | 2000-229262 A | 8/2000 |
| JP | 2000-279860 A | 10/2000 |
| JP | 2006-314990 A | 11/2006 |
| JP | 2008-136884 A | 6/2008 |
| JP | 2013-202455 A | 10/2013 |
| JP | 5897749 B1 | 3/2016 |
| JP | 5981594 B1 | 8/2016 |
| JP | 2016-155114 A | 9/2016 |
| JP | 2016-174989 A | 10/2016 |
| JP | 2016-174992 A | 10/2016 |
| TW | 200724245 A | 7/2007 |

\* cited by examiner

COATING METHOD, COATING BAR HEAD AND COATING APPARATUS

CROSS REFERENCE TO RELATED APPLICATIONS

This application is based upon and claims the benefit of priority from the prior International Patent Application PCT/JP2019/035560, filed on Sep. 10, 2019, the entire contents of which are incorporated herein by reference.

FIELD

Embodiments of the present invention relates to a coating method, a coating bar head and a coating apparatus.

BACKGROUND

Organic thin-film solar cells and organic-inorganic hybrid solar cells using organic semiconductors are expected as low-cost solar cells, since inexpensive coating methods can be used for the formation of active layers. In order to achieve the production of organic thin-film solar cells and organic-inorganic hybrid solar cells at low cost, it is required to uniformly coat coating materials for forming organic active layers and other layers. Each layer has a film thickness of from about several nanometers to several hundred nanometers, and it is required to form such an extremely thin layer over a large area, with a high uniformity. For example, meniscus coating is known as one of roll to roll (R2R) coating methods which are capable of coating a very thin layer over large area, at low cost. However, in a conventional meniscus coating method, changes in the coating thickness are more likely to occur, since the distance between a substrate and a coating bar head is more likely to change when coating is performed at a high speed. In cases where a uniform coating thickness is required, as in the case of a common solar cell module, changes in the coating thickness are required to be small. Therefore, an improved meniscus coating method is needed, which allows for obtaining a uniform coating thickness even when coated at a high speed.

DETAILED DESCRIPTION

Figure 1:
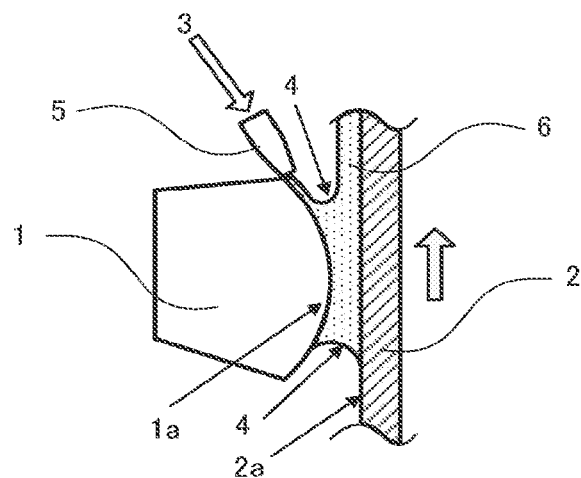
FIG. 1 is a schematic diagram illustrating a coating method according to an embodiment of the present invention.

A coating method according to an embodiment of the present invention is a coating method including:
supplying a coating liquid between a coating bar head and a substrate to form a meniscus; and
moving the substrate to form a coating film on the surface of the substrate;
wherein a cross section of the coating bar head in the direction perpendicular to the longitudinal direction thereof has, on the periphery thereof:
(a) a curve which is convex outward and which corresponds to a cylindrical surface of the bar head opposed to the substrate; and
(b) two bending points which are located at both ends of the curve and which correspond to the ends of the cylindrical surface in parallel with the longitudinal direction thereof; and
wherein the curve in the cross section has a curvature radius of from 10 to 100 mm.

A coating bar head according to an embodiment of the present invention is a coating bar head for meniscus coating,
wherein, in the meniscus coating, a coating liquid is supplied between a coating bar head and a substrate to form a meniscus, and the substrate is moved,
wherein a cross section of the coating bar head in the direction perpendicular to the longitudinal direction thereof has, on the periphery thereof:
(a) a curve which is convex outward and which corresponds to a cylindrical surface of the bar head opposed to the substrate; and
(b) two bending points which are located at both ends of the curve and which correspond to the ends of the cylindrical surface in parallel with the longitudinal direction thereof; and
wherein the curve in the cross section has a curvature radius of from 10 to 100 mm.

A coating apparatus according to an embodiment of the present invention is a coating apparatus including:
a coating bar head;
a substrate transport member; and
a coating liquid supply member;
wherein these members are disposed such that a meniscus is formed between the bar head and a substrate which is transported by the substrate transport member, when a coating liquid is supplied therebetween;
wherein a cross section of the coating bar head in the direction perpendicular to the longitudinal direction thereof has, on the periphery thereof:
(a) a curve which is convex outward and which corresponds to a cylindrical surface of the bar head opposed to the substrate; and
(b) two bending points which are located at both ends of the curve and which correspond to the ends of the cylindrical surface in parallel with the longitudinal direction thereof; and
wherein the curve in the cross section has a curvature radius of from 10 to 100 mm.

Embodiments will now be explained with reference to the accompanying drawings.

Configurations common to the embodiments are designated with the same reference numerals, and redundant description will be omitted. Further, respective figures are schematic diagrams for illustrating the embodiments and facilitating the understanding thereof, and the shapes, dimensions, ratios and the like thereof may be different from those of the actual apparatus. The designs of these can be modified as appropriate, in consideration of the following description and known techniques.

FIG. 1 is a schematic diagram (cross-sectional view) illustrating a coating method according to an embodiment of the present invention. In the coating method, a coating liquid 3 is supplied between a curved surface 1a of a coating bar head 1, which surface is opposed to a substrate 2, and the substrate 2 which is moving, to continuously form a coating film 6 on a substrate surface 2a. In the embodiment shown in FIG. 1, the substrate 2 is moving upward from below in the vertical direction, and the curved surface of the coating bar head is disposed so as to be opposed to the substrate surface 2a. Then the coating liquid 3 is supplied from a coating liquid supply nozzle 5 onto the curved surface of the coating bar head, and a meniscus 4 is formed between the curved surface of the coating bar head and the substrate, due to the surface tension of the coating liquid.

Figure 2:
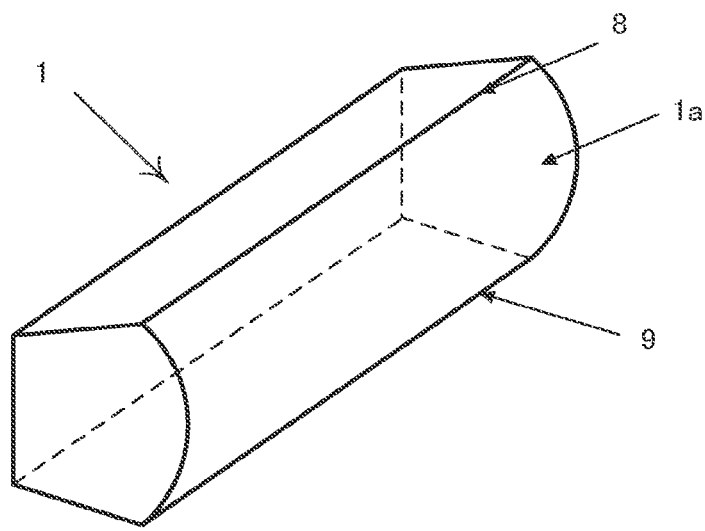
FIG. 2 is a perspective view of a coating bar head embodiment according to an embodiment of the present invention.
Figure 3:
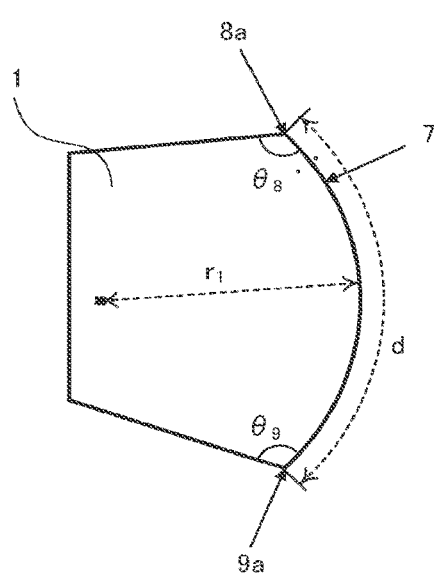
FIG. 3 is a diagram illustrating a cross-sectional shape of the coating bar head.
Figure 4:
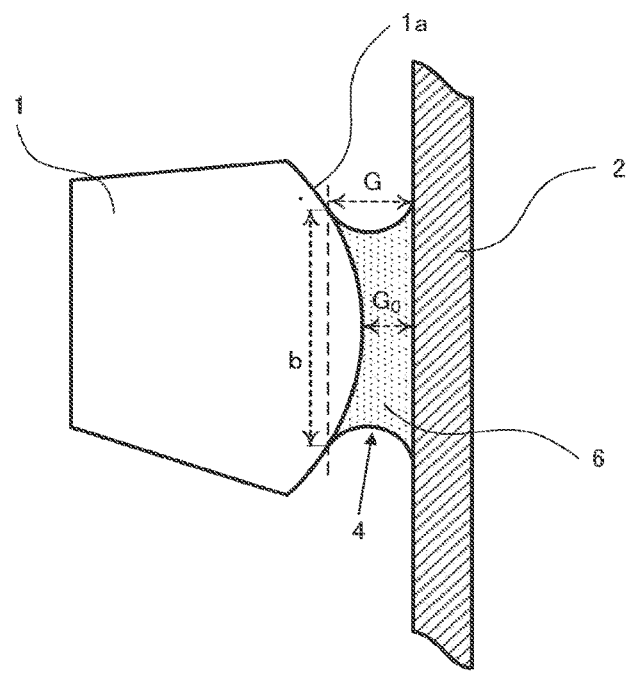
FIG. 4 is a cross-sectional view illustrating the relationship among the coating bar head, a planar substrate, and a meniscus formed therebetween.

In the present embodiment, the coating bar head has a specific shape. FIG. 2 shows a perspective view of the coating bar head used in the embodiment; FIG. 3 shows a cross-sectional view in the direction perpendicular to the longitudinal direction of the coating bar head; and FIG. 4 shows a diagram illustrating the state in which the coating liquid 6 is introduced between the coating bar head 1 and the substrate 2, which is planar, to form the meniscus 4. As shown in FIG. 2, the surface 1a of the coating bar head, opposed to the substrate, is a cylindrical surface protruding outward. The cylindrical surface has ridge lines 8 and 9 at the ends of the cylindrical surface in parallel with the longitudinal direction thereof.

The shape of the coating bar head can be characterized by the shape of a cross section in the direction perpendicular to the longitudinal direction thereof. The cross section has a shape including, on the periphery thereof:

(a) a curve which is convex outward and which corresponds to a cylindrical surface of the bar head opposed to the substrate; and (b) two bending points which are located at both ends of the curve and which correspond to the ends of the cylindrical surface in parallel with the longitudinal direction thereof. Further, the curve in the cross section has a curvature radius of from 10 to 100 mm.

The portion of the coating bar head 1 which corresponds to the surface 1a opposed to the substrate 2 is a curve 7. The curve 7 has a shape which is convex outward. The curve 7 has bending points 8a and 9a corresponding to the ridge lines 8 and 9, respectively, at both ends thereof. The curve 7 is typically a single circular arc. In FIG. 3, the curve 7 is a circular arc having a curvature radius of $r_1$.

The bending points 8a and 8b have bending angles $\theta_8$ and $\theta_9$, respectively; and the length of the curve between the bending points 8a and 8b is length d.

The coating bar head 1 and the substrate 2 are disposed at a minimum gap $G_0$; the coating liquid layer to be formed between the coating bar head 1 and the substrate 2 has a maximum thickness G; and the coating liquid layer has a width b.

The present inventors have investigated the relationships between these parameters and the coating film thickness in specific detail, and examined the relationships between the minimum gap $G_0$ or the curvature radius $r_1$, and the coating film thickness upon changes in meniscus liquid amount L. As a result, the present inventors have found out, when the surface 1a of the coating bar head is a cylindrical surface (developable surface) protruding outward, namely, when the portion corresponding to the cylindrical surface, in the cross section of the coating bar head, is a curve convex outward, that changes in the coating film thickness are small in cases where the minimum gap $G_0$ changes. When an R2R high-speed coating is performed by meniscus coating, the gap between the coating bar head and the substrate is prone to change due to vibration and the like, but such an influence can be reduced by the use of a coating bar head having a specific shape.

Further, by providing the ridge lines 8 and 9 on both sides of the surface 1a opposed to the substrate, instead of forming a coating bar head in the form of a cylinder, namely, by providing the bending points 8a and 8b on both ends of the curve 7 in the cross section, the position of the meniscus is stabilized by the pinning effect, as a result of which changes in the coating film thickness are reduced. Since a cylindrical bar is used in a conventional meniscus coating method, the size of the coating apparatus used needs to be increased in the case of using a cylindrical bar having a high curvature. Further, the shape and the position of a nozzle for introducing a coating liquid are restricted, for example, resulting in a poor operability. When the cylindrical surface of the coating bar head has ridge lines at both ends thereof, the size of the bar head can be reduced, and the operability is improved.

The respective parameters will now be described in specific detail.

The coating film thickness increases when the thickness G and the width b of the coating liquid layer present between the coating bar head 1 and the substrate 2 are increased. Accordingly, when the thickness G and the width b are stable during coating, the resulting coating film has a uniform thickness. However, since the amount of the coating liquid supplied from a nozzle during coating is constant in general, changes in the thickness G or the minimum gap $G_0$ leads to changes in the width b, and the coating film thickness is more likely to be nonuniform. In order to minimize the influence of such changes, it is effective to adjust the curvature radius r1. In the present embodiment, the curvature radius $r_1$ is from 10 to 100 mm, and preferably from 20 to 80 mm, in order to stabilize the thickness G, the minimum gap $G_0$ or the width b, and to form a uniform coating film. The curve 7 need not be a single circular arc, and may include a portion having a different curvature radius. In such a case, it is preferred that the curve 7 have an average curvature radius within the above described range. In such a case, the average curvature radius is referred to as the curvature radius, for convenience.

The minimum gap $G_0$ between the coating bar head and the substrate is preferably from 80 to 600 μm, more preferably from 100 to 500 μm, and particularly preferably from 150 to 400 μm. When the minimum gap is smaller than the above described range, streaky unevenness is more likely to occur. When the minimum gap is larger than the above described range, the coating film tends to have too large a thickness, and to have an uneven thickness due to uneven drying. The minimum gap can be controlled using an actuator, a gap ring or the like.

The angles $\theta_8$ and $\theta_9$ at the bending points are preferably from 90 to 150°, and more preferably from 100 to 130°. When the angles $\theta_8$ and $\theta_9$ are smaller than the above described range, it becomes difficult for the coating liquid to return to the cylindrical surface 1a upon overflowing across the ridge lines. When the angles $\theta_8$ and $\theta_9$ are larger than the above described range, the effect of stabilizing the position of the coating liquid layer (pinning effect) tends to decrease. It is noted here that the bending points 8a and 8b need not be "points", and may each be, for example, a chamfered or filleted corner. In cases where each bending point is a filleted corner, and when the filleted portion has a large curvature radius, the pinning effect and the like are reduced; accordingly, the curvature radius at each bending point is preferably 1 mm or less.

Further, in the coating bar head shown in FIG. 3, the angles $\theta_8$ and $\theta_9$ are different from each other, and the cross section of the bar head is asymmetrical with respect to the axis extending in the direction perpendicular to the coating surface. However, the cross section of the bar head may be symmetrical.

The length d of the curve between the bending points is preferably from 5 to 30 mm, and more preferably from 7 to 25 mm. When the length d is shorter than the above described range, the resulting meniscus is more likely to be unstable. When the length d is longer than the above described range, the resulting coating film tends to have too large a thickness, and liquid supply tends to be difficult due to an increased size of the bar head.

The surface of the coating bar head may be a mirror surface, or may be a cloudy surface with unevenness. The cloudy surface tends to have a better wettability with the coating liquid. Further, the surface of the coating bar head may be a combination of a plurality of surfaces having different wettabilities. For example, it is preferred that the surface 1a onto which the coating liquid is supplied have a good wettability, and the side surfaces, which are in contact with the surface 1a with the ridge lines 8 and 9 as boundaries, have a poor wettability, because the pinning effect can be increased. Further, the coating bar head may include a dividing groove arranged in the transverse direction thereof. This enables the formation of coating films in the form of strips.

The moving direction of the substrate is not particularly limited. However, it is preferred that the coating is performed while transporting the substrate upward from below. As shown in FIG. 1, for example, gravity is applied to the meniscus portion by moving the substrate upward from below in the vertical direction, and thus a uniform film can be more easily formed even when coated at a high speed. However, the moving direction can be adjusted depending on the configuration of the apparatus and the physical properties of the coating liquid to be used, and is usually within the range of ±30° with respect to the vertical direction.

Although FIG. 1 shows an example in which the substrate has a plate-like shape, the substrate may be curved so as to protrude toward the side of the coating bar head. In other words, by providing a roller or the like on the side of the substrate opposite to the coating bar head, the substrate can be made to curve such that the substrate surface protrudes toward the side of the coating bar head, at the portion where the meniscus is formed.

In this case, when the curvature radius of the curve of the coating bar head is defined as $r_1$, and the curvature radius of the curved portion of the substrate is defined as $r_2$, $r_0$ represented by the following formula:

$r_0=1/[(1/r_1)+(1/r_2)]$ is preferably from 20 to 80 mm, and more preferably from 40 to 60 mm. Further, it is preferred that $r_2>r_1$ or $r_2 \geq 200$ mm is satisfied.

When the curved portion of the substrate has a larger curvature radius $r_2$, a lower stress is applied to the substrate, resulting in a lower strain. When the substrate includes a fragile film, the curved portion preferably has an extremely large curvature radius $r_2$.

Figure 5:
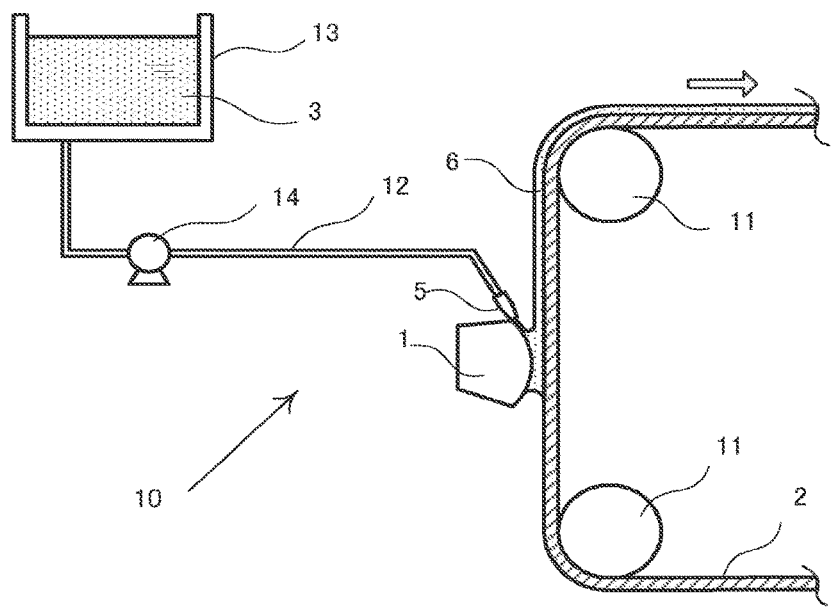
FIG. 5 is a schematic diagram illustrating a coating apparatus according to an embodiment of the present invention.

FIG. 5 is a schematic diagram of a coating apparatus 10. The coating apparatus 10 includes: the coating bar head 1; rollers 11 as substrate transport members that transport the substrate 2; a nozzle 5 as a coating liquid supply member that supplies the coating liquid 3 to the coating bar head 1; and a pump 14 that supplies the coating liquid 3 from a tank 13 to the nozzle 5 through a tube 12. In cases where the coating is performed over a large coating width, namely, when the coating bar head has a large length in the longitudinal direction, it is desirable to provide a plurality of nozzles arranged in parallel in the longitudinal direction of the coating bar head. It is preferred that the nozzles be each individually detachable, and the distances between the nozzles can be changed, in order to facilitate maintenance, and to obtain a uniform film depending on the physical properties of the coating liquid. Alternatively, each nozzle may be provided as one slit. In this case, it is preferred that the interior of the slit be provided with a liquid reservoir, an uneven structure, a flow channel or the like for achieving liquid supply in a uniform manner.

The substrate transport members are preferably those that transport the substrate upward from below, and the coating liquid supply member is preferably one that supplies the coating liquid from the upper portion of the coating bar head. This makes gravity to be applied to the meniscus portion, and enables coating at a higher speed. Further, the dripping of the coating liquid can be reduced by supplying the coating liquid from the upper portion of the coating bar head.

The coating apparatus 10 can further include a member that measures and controls the distance (G or $G_0$) between the coating bar head and the substrate. This member enables to further improve the uniformity of the coating film thickness.

The coating apparatus 10 can further include a washing member that washes the coating bar head. This allows for washing the coating bar head on a regular basis, and eliminating impurities coming in from an atmosphere and solids precipitated from the coating liquid. Specifically, the washing member may be, for example, a member that sprays or injects a solvent such as water, or a member that applies an ultrasonic wave.

The coating apparatus 10 can further include a member that collects an excessive coating liquid during coating. This member facilitates the prevention of the backward flow of the coating liquid and the loss of an expensive coating liquid, as well as the prevention of the release of the solvent and the like into the environment.

Example 1

In Example 1, the step of coating a coating material was carried out as follows, using the coating apparatus 10 shown in FIG. 5. First, a coating bar head made of SUS 303 and having a length in the coating width direction of 100 mm is prepared, in which, in the cross section of the coating bar head shown in FIG. 3, the curvature radius $r_1$ is 40 mm, the angles $\theta_8$ and $\theta_9$ at the bending points are 120° and 90°, respectively, and the length of the curve between the bending points is 25 mm.

To 1 mL of monochlorobenzene, 8 mg of PTB7 ([poly{4,8-bis[(2-ethylhexyl)oxy]benzo[1,2-b:4,5-b']dithiophene-2,6-diyl-1t-alt-3-fluoro-2-[(2-ethylhexyl)carbonyl]thieno[3,4-b]thiophene-4,6-diyl}]/p-type semiconductor), and 12 mg of PC70BM ([6,6]phenyl-C71-butyric acid methyl ester/n-type semiconductor) are dispersed, to prepare a coating liquid, which is a material for forming an organic active layer of a solar cell. The coating liquid supply member includes five nozzles, whereby the coating liquid is supplied between the coating bar head and the substrate. The coating liquid is supplied to the nozzles from one tank through five tubes, by applying a nitrogen pressure to the tank. The respective nozzles are provided at intervals of 20 mm. Each nozzle is a needle made of stainless steel. The object to be coated is a substrate composed of a PET film roll provided with indium tin oxide (ITO) on the side of the surface to be coated. The coating bar head is disposed, using an actuator, such that the minimum gap distance between the coating bar head and the PET substrate is 150 μm. A quantity of 40 μL of the coating liquid is supplied from each nozzle to the coating bar head, to form a meniscus column. While adjusting the angles of the nozzles and the gap distance, the coating liquid is coated on the PET substrate to obtain a coating film. The moving speed of the PET substrate is controlled constant at 83 mm/s. The coating liquid is continuously supplied from the nozzles, and coated to a length of 20 m. The film thickness after drying, of the mid-portion of the coating film in a length of 18 m, was measured from the absorption spectrum of the film, and the coating film thickness in a wet state was determined. As a result, the coating film thickness is 10.5±0.1 μm.

Example 2

The coating is carried out in the same manner as in Example 1, except for using a coating bar head made of SUS 303 and having a curvature radius of 10 mm. The resulting coating film has a thickness of 11.2±0.3 μm.

Example 3

The coating is carried out in the same manner as in Example 1, except for using a coating bar head made of SUS 303 and having a curvature radius of 100 mm. The resulting coating film has a thickness of 9.5±0.3 μm.

Example 4

The coating is carried out in the same manner as in Example 1, except that the minimum gap distance $G_0$ is adjusted to 550 μm, and that 600 μL of the coating liquid is supplied from each nozzle, to form a meniscus column. The resulting coating film has a thickness of 25.0±0.3 μm.

Example 5

The coating is carried out in the same manner as in Example 1, except that a roller having a curvature radius of 200 mm is disposed so as to be opposed to the coating bar head, so that the substrate is made to curve so as to protrude toward the bar head, and that a coating bar head made of SUS 303 and having a curvature radius of 80 mm is used. The curvature radius $r_0$ generated by the above arrangement is 57 mm. The resulting coating film has a thickness of 10.0 μm, and a nonuniformity of less than 0.1 μm.

Comparative Example 1

The coating is carried out in the same manner as in Example 1, except for using a coating bar head made of SUS 303 and having a level bottom surface. The resulting coating film has a thickness of 12.0±1.0 μm.

Comparative Example 2

The coating is carried out in the same manner as in Example 1, except for using a coating bar head made of SUS 303 and having a curvature radius of 8 mm. The resulting coating film has a thickness of 13.0±0.7 μm.

Comparative Example 3

The coating is carried out in the same manner as in Example 1, except for using a coating bar head made of SUS 303 and having a curvature radius of 110 mm. The resulting coating film has a thickness of 9.2±0.6 μm.

While several embodiments of the present invention have been described, these embodiments have been presented by way of example only, and are not intended to limit the scope of the inventions. These novel embodiments can be implemented in a variety of other forms, and various omissions, substitutions and changes can be made without departing from the spirit of the inventions. These embodiments and modifications thereof are included in the scope and spirit of the invention, and are included in the invention described in the claims and their equivalents.

The invention claimed is:

1. A coating apparatus comprising:
   a coating bar head;
   a substrate transport member; and
   a coating liquid supply member;
   wherein said coating bar head, said substrate transport member, and said coating liquid supply member are disposed such that a meniscus is formed between said coating bar head and a substrate which is transported by said substrate transport member, when a coating liquid is supplied therebetween;
   wherein a cross section of said coating bar head in the direction perpendicular to the longitudinal direction thereof has, on the periphery thereof:
   (a) a curve which is convex outward and which corresponds to a cylindrical surface of said coating bar head opposed to said substrate; and
   (b) two bending points which are located at both ends of the curve and which correspond to the ends of said cylindrical surface in parallel with the longitudinal direction thereof; and
   wherein the curve in the cross section has a curvature radius of from 10 to 100 mm; and
   wherein said substrate is curved to protrude toward said coating bar head, at a portion thereof where the meniscus is formed; and
   wherein, when the curvature radius of the curve in the cross section of said coating bar head is defined as $r_1$, and the curvature radius of the curved portion of said substrate is defined as $r_2$, $r_0$ represented by the following formula:

$$r_0 = 1/[(1/r_1) + (1/r_2)]$$

is from 20 to 80 mm.

2. The coating apparatus according to claim 1, wherein $$r_2 > r_1$$

or $$r_2 \geq 200 \text{ mm}$$

is satisfied.

3. The coating apparatus according to claim 1, wherein said coating bar head is fixed horizontally, and said substrate transport member transports said substrate upward from below.

4. The coating apparatus according to claim 3, wherein said coating liquid supply member includes a coating liquid supply nozzle is disposed at the upper portion of said coating bar head.

5. The coating apparatus according to claim 1, further comprising a device that measures and controls the distance between said coating bar head and said substrate.

6. The coating apparatus according to claim 1, further comprising a washing member that washes said coating bar head.

7. The coating apparatus according to claim 1, further comprising a member that collects an excessive coating liquid during coating.

\* \* \* \* \*